United States Patent
Matsuura

[19]

[11] Patent Number: 6,084,678
[45] Date of Patent: Jul. 4, 2000

[54] METHOD OF ALIGNMENT BETWEEN MASK PATTERN AND WAFER PATTERN

[75] Inventor: Seiji Matsuura, Tokyo, Japan

[73] Assignee: NEC Corporation, Tokyo, Japan

[21] Appl. No.: 09/129,124

[22] Filed: Aug. 4, 1998

[30] Foreign Application Priority Data

Aug. 4, 1997 [JP] Japan ..................... 9-208999

[51] Int. Cl.⁷ .................................. G01B 11/00
[52] U.S. Cl. ................. 356/401; 356/363; 250/548; 250/559.3; 355/53; 430/30; 430/22
[58] Field of Search ................. 356/150, 401, 356/399, 400, 153, 349, 363; 430/22, 30; 250/237 G, 548; 355/53, 67; 378/34

[56] References Cited

U.S. PATENT DOCUMENTS

| | | | |
|---|---|---|---|
| 4,568,189 | 2/1986 | Bass et al. ........................... | 356/150 |
| 4,991,962 | 2/1991 | Jain ..................................... | 356/349 |
| 5,521,036 | 5/1996 | Iwamoto et al. ..................... | 430/22 |
| 5,559,601 | 9/1996 | Gallatin et al. ...................... | 356/363 |
| 5,783,342 | 7/1998 | Yamashita et al. .................. | 430/30 |
| 6,018,395 | 1/2000 | Mori et al. ........................... | 356/401 |

OTHER PUBLICATIONS

S. Slonaker et al., "Enhanced global alignment for production optical lithography", pp. 73–81, Optical/Laser Microlithograph SPIE, vol. 922, 1988.

Primary Examiner—Frank G. Font
Assistant Examiner—Layla G. Lauchman
Attorney, Agent, or Firm—Young & Thompson

[57] ABSTRACT

A method of aligning a mask pattern and a wafer pattern by referring to alignment marks on chips is provided wherein all of the chips to be used for alignment are classified into a plurality of groups so that the shot array alignment is carried out by referring to the alignment marks which are provided at different positions in individual chips. The alignment marks and chip positions for the alignment marks are different for each of the groups.

19 Claims, 8 Drawing Sheets

CHIP ROTATION

METHOD OF ALIGNMENT BETWEEN MASK PATTERN AND WAFER PATTERN

BACKGROUND OF THE INVENTION

The present invention relates to a method of alignment between a mask pattern and a wafer pattern for a projection exposure system.

An alignment between a mask pattern and a wafer pattern is conducted for exposure of a mask pattern or a reticule to a resist applied on a wafer. As semiconductor integrated circuit patterns have been required to be scaled down, a highly accurate alignment between the mask pattern and the wafer pattern has also been required. In general, the accuracy of alignment between the mask pattern and the wafer pattern should be within one quarter or one third of the minimum design size. For example, 64-mega dynamic random access memory has a minimum design size of 0.35 micrometers. In this case, the accuracy of alignment between the mask pattern and the wafer pattern should be within 0.10 micrometers. 256-mega dynamic random access memory has a minimum design size of 0.25 micrometers. In this case, the accuracy of alignment between the mask pattern and the wafer pattern should be within 0.07 micrometers. 1-giga dynamic random access memory has a minimum design size of 0.18 micrometers. In this case, the accuracy of alignment between the mask pattern and the wafer pattern should be within 0.05 micrometers.

There are many factors which might influence to the alignment accuracy. In one viewpoint, those factors may be classified into two types. One is concerned with an alignment in chip and another is concerned with an alignment between chips or a shot array alignment.

Figure 1:
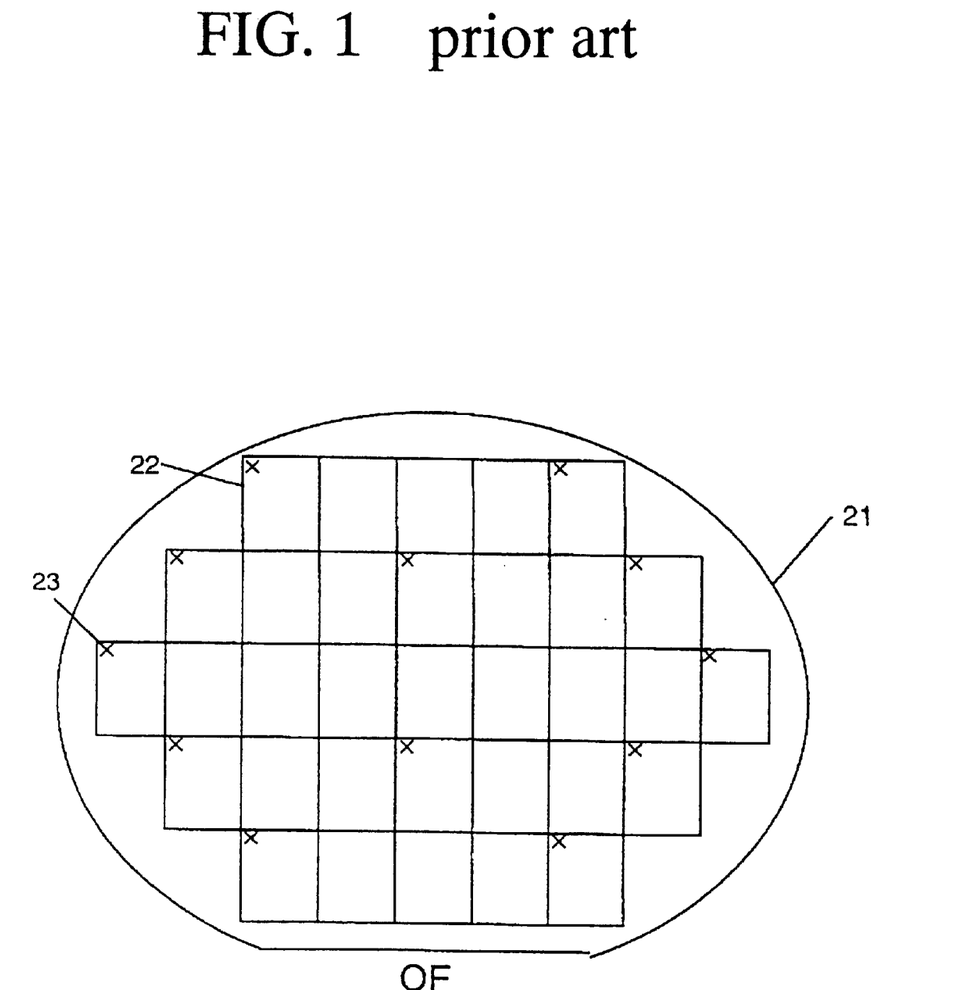
FIG. 1 is a plan view illustrative of a conventional method of an alignment between chips.

FIG. 1 is a plan view illustrative of a conventional method of the shot array alignment. The shot array alignment is conducted as follows. Alignment marks are provided over a mask at a single point in each area corresponding to selected ones of the chips. Further, alignment marks "×" 23 are also provided at top left corners of shot maps 22 over a wafer 21 so that the alignment marks "×" 23 correspond in position to the alignment marks over the mask. The shot array alignment is conducted to align one of the mask alignment marks in each area to the corresponding one of the wafer alignment marks but there is not considered an issue of any further correspondences between the remaining mask alignment marks in the same area and the remaining wafer alignment marks.

Figure 2:
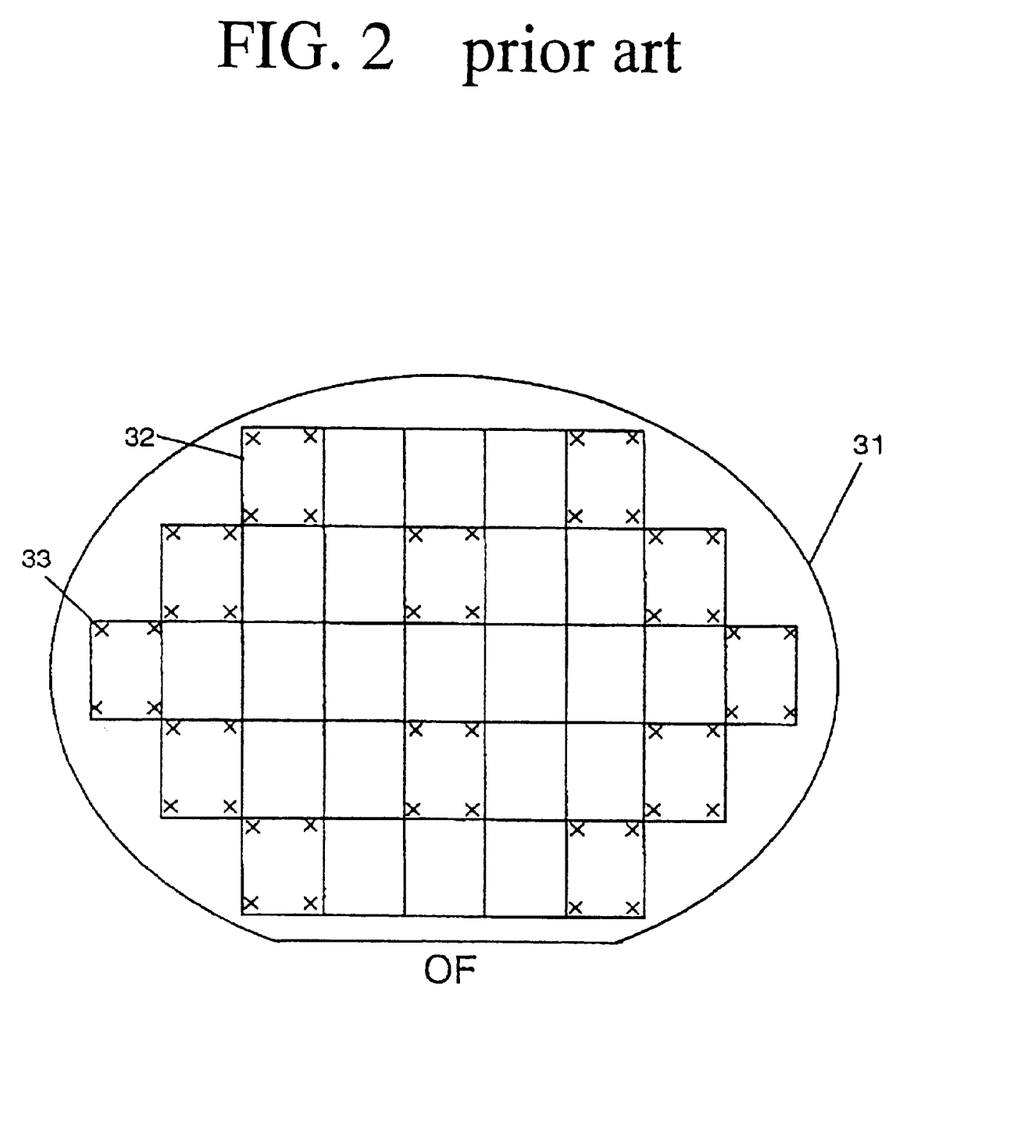
FIG. 2 is a plan view illustrative of a conventional method of the chip-in-alignment. The chip-in-alignment is conducted as follows. Alignment marks are provided over a mask at plural points in each area corresponding to selected ones of the chips.

FIG. 2 is a plan view illustrative of a conventional method of the chip-in-alignment. The chip-in-alignment is conducted as follows. Alignment marks are provided over a mask at plural points in each area corresponding to selected ones of the chips. Further, alignment marks "×" 33 are also provided at four corners of shot maps 32 over a wafer 31 so that the alignment marks "×" 33 correspond in position to the alignment marks over the mask. The chip-in-alignment is conducted to align the mask alignment marks to the corresponding ones of the wafer alignment marks.

The accuracy of the shot array alignment is likely to be influenced by an accuracy of an alignment sensor in an exposure system and an accuracy of a stage. In the meantime, the accuracy of chip-in-alignment is likely to be influenced by an expansion of the wafer in manufacturing processes, lens distortion and reticule or mask rotation.

Improvements in accuracy of the shot array alignment and the chip-in-alignment are important issues. If, however, the alignment is applied for manufacturing the 256-mega dynamic random access memory, then the accuracy of the chip-in-alignment is extremely important because if there exist errors in a constant magnification and a rotation in the chip, then the increase in size of the chip results in an increase in misalignment in the chip.

Figure 3:
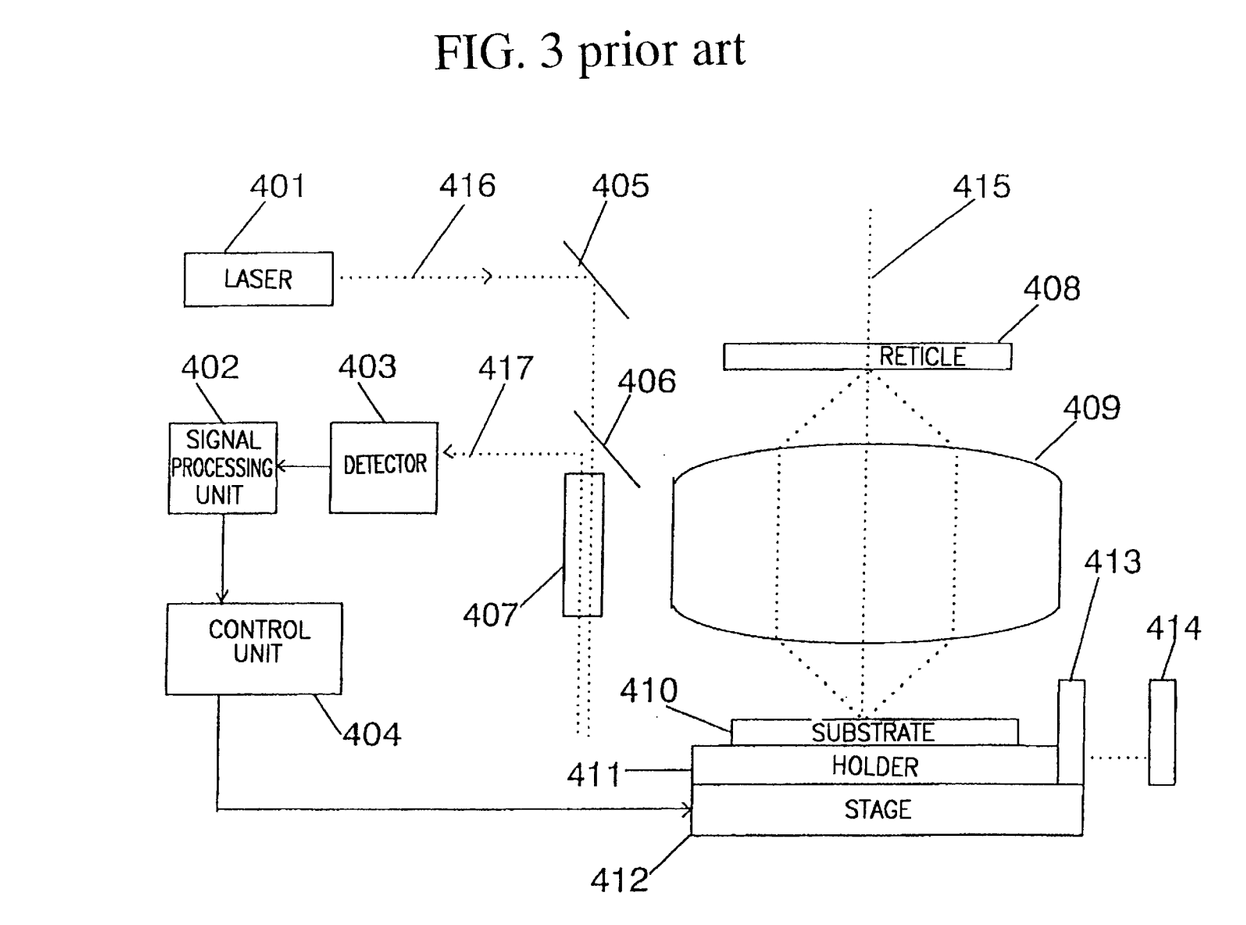
FIG. 3 is a schematic view illustrative of a conventional method of the alignment, wherein an exposure system is represented by a block diagram and broken lines represent traveling of light.

FIG. 3 is a schematic view illustrative of a conventional method of the alignment, wherein an exposure system is represented by a block diagram and broken lines represent traveling of light.

A semiconductor substrate 410 is fixed onto a wafer holder 411 by a vacuum suction force so that the semiconductor substrate 410 is mounted on a wafer stage 412. The wafer stage 412 is movable in X-directions, Y-directions and vertical directions under control of a control unit 404 so that a relative position between the semiconductor substrate 410 and a reticule 408 is adjusted.

The reticule 408 is first aligned to an exposure axis by use of a reticule alignment optical system which is not illustrated. Then, the semiconductor substrate 410 is aligned by use of an off-axis optical system 407 positioned outside the projection optical system, wherein the position is fixed with reference to the exposure axis. Namely, the wafer stage 412 is moved to a position under the off-axis optical system 407 so that an He—Ne laser 401 emits an alignment indent light 416 which is transmitted toward a reflection mirror 405. The alignment indent light 416 is hen reflected by the reflection mirror 405 and then transmitted through the off-axis optical system 407 onto an alignment mark not illustrated on the semiconductor substrate 410. The light 416 is diffracted by the alignment mark on the semiconductor substrate 410 and then a diffracted light 417 is transmitted toward a reflection mirror 406. The light 417 is then reflected by the reflection mirror 406 and then transmitted to a detector 403. The detector 403 detects the diffracted light 417 so as to detect a position of the alignment mark on the semiconductor substrate 410. The detector 403 outputs an alignment signal which is transmitted to an alignment signal processing unit 402 so that this information of the alignment mark position detected by the detector 403 is processed by the alignment signal processing unit 402. The processed signal is then sent to the control unit 404 so that the control unit 404 controls movements of the wafer stage 412 in accordance with the processes signal from the alignment signal processing unit 402. Namely the movement of the wafer stage 412 is controlled by the off-axis optical system 407 for realizing an indirect alignment before the wafer stage 412 mounted thereon with the semiconductor substrate 410 is moved to an exposure position thereby conducting an exposure of the pattern of the reticule 408 to the semiconductor substrate 410. It is also possible to use the optical system for exposure instead of the off-axis optical system so that an exposure light 415 is used as an alignment incident light to be transmitted through a projection lens 409. A wise-band wavelength light may be used as the alignment incident light for detection of the alignment mark position.

If at least one alignment mark is provided on each chip, then the shot array alignment selects plural chips so as to obtain positional information for individual alignment marks which are provided at the same positions of the individual chips. This method is disclosed by S. Slonaker et al, SPIE 922 (1988) 73p. This method will be described with reference again to FIG. 3. A single alignment mark is provided in each of the chips. On the basis of positional informations of the alignment marks of not less than ten chips over the semiconductor substrate 410, a shift, a scaling, a rotation and an orthogonality can be found. Those obtained parameters are used for feeding back to the movement of the wafer stage 412 holding the semiconductor substrate 410 in exposure process so that a highly accurate shot array alignment can be conducted.

If a plurality of the alignment marks are provided in each chip, then a chip scaling (magnification) and a chip rotation are found from the positional information of the alignment marks in the individual chips. In order to obtain those parameters both in X-direction and in Y-direction, it is necessary to measure positions of at least three alignment marks in each chip and if a highly accurate alignment is required, then at least four alignment marks are measured in those positions. It is of course preferable that the individual alignment marks are distributed in position within the chips. Those parameters are used for feeding back to the lens projection magnification, the rotation direction of the reticule 408 and the movements of the wafer stage 412 holding the semiconductor substrate 410 in the exposure process so that a highly accurate alignment may be conducted.

The above conventional alignment methods are, however, engaged with the following problems.

The shot array alignment is conducted based upon the positional information of a single alignment mark provided in the chip, for which reason from those available informations, no informations can be obtained about magnifications of the chip or the chip scaling and the chip rotation.

Figure 4A:
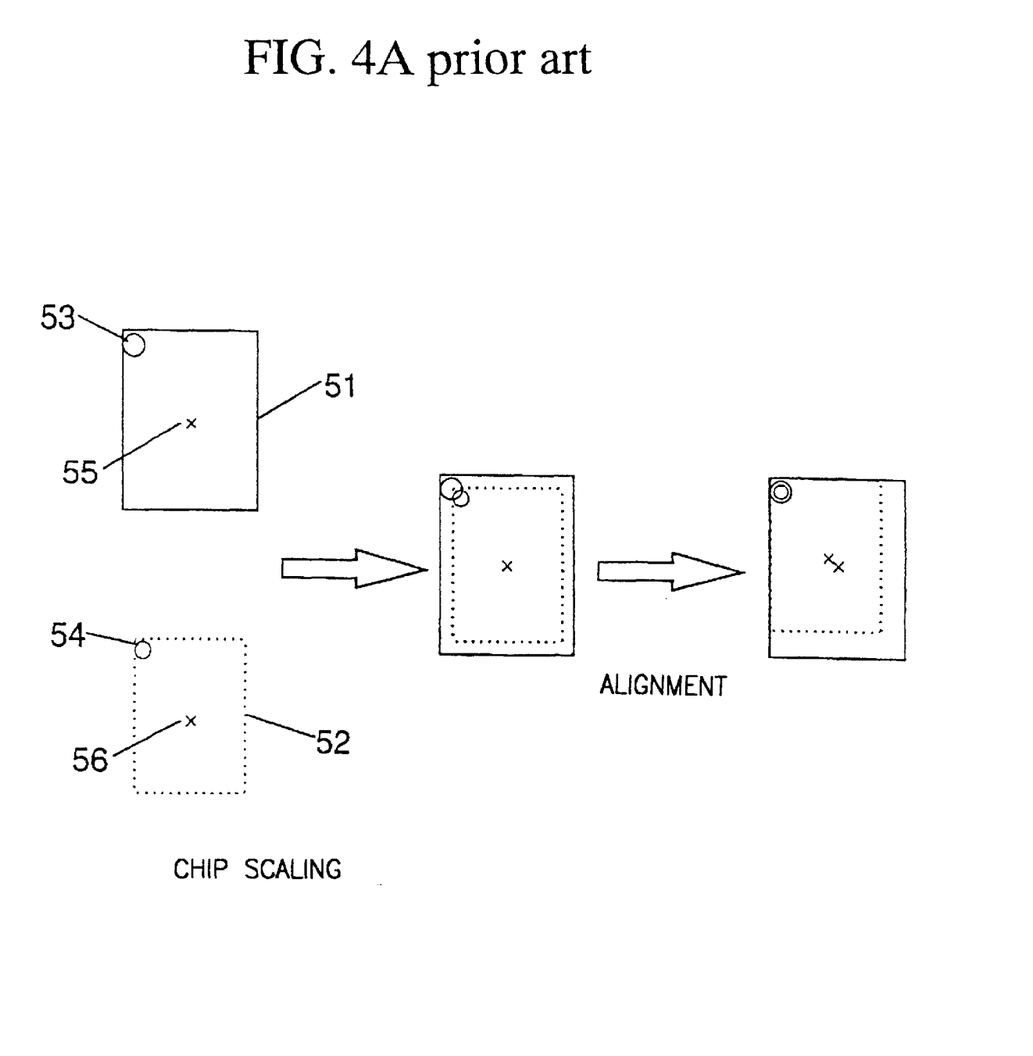
FIG. 4A is a plan view illustrative of a problem with chip scaling raised by the fact that the alignment mark is normally provided at a corner of the rectangular-shaped chip.
Figure 4B:
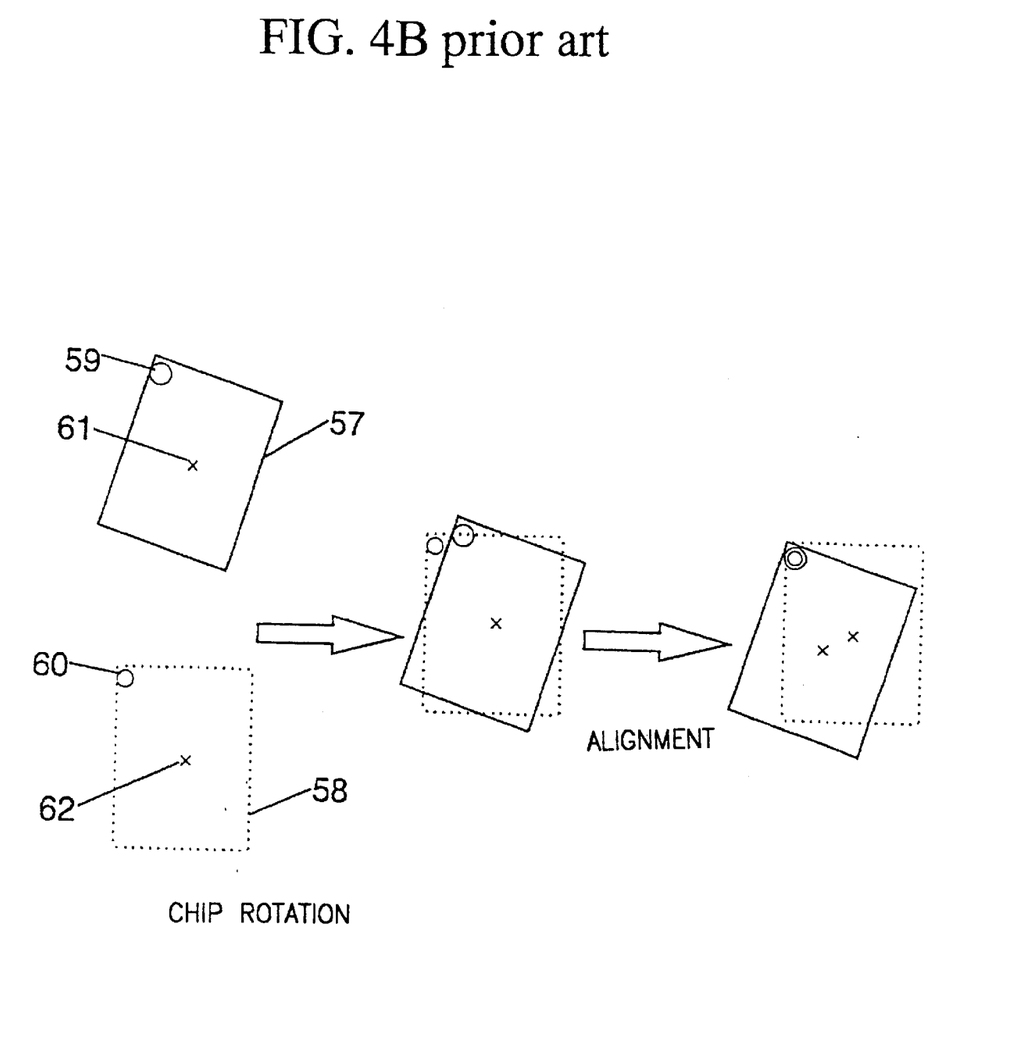
FIG. 4B is a plan view illustrative of a problem with chip rotation raised by the fact that the alignment mark is normally provided at a corner of the rectangular-shaped chip.

FIG. 4A is a plan view illustrative of a problem with chip scaling when alignment mark is normally provided at a corner of the rectangular-shaped chip. FIG. 4B is a plan view illustrative of a problem with chip rotation when the alignment mark is normally provided at a corner of the rectangular-shaped chip.

As illustrated in FIG. 4A, a single alignment mark "○" 53 is provided at a top left corner of a currently processing chip 51, whilst a single alignment mark "○" 54 is also provided at a top left corner of a previously processes chip 52. Even if there is a chip scaling between the currently processing chip 51 and the previously processed chip 52, then an alignment is conducted with reference to only the alignment marks "○" 53 and 54, for which reason it is impossible to confirm the presence of the chip scaling. If the alignment is made by superimposition of the alignment marks "○" 53 and 54, then an off-set in center of gravity is caused between the currently processing chip 51 and the previously processes chip 52, wherein the center of gravity is represented by "×".

As illustrated in FIG. 4B, even if there is a chip rotation between the currently processing chip 51 and the previously processes chip 52, then the alignment is conducted with reference to only the alignment marks "○" 53 and 54, for which reason it is impossible to confirm the presence of the chip rotation. If the alignment is made by superimposition of the alignment marks "○" 53 and 54, then an off-set in center of gravity is caused between the currently processing chip 51 and the previously processes chip 52, wherein the center of gravity is represented by "×".

In the meantime, the chip-in-alignment is conducted based upon positional information of a plurality of the alignment marks provided in each chip, for which reason the chip-in-alignment is free from the above problems with impossibility of confirmation of the presence of the chip scaling and chip rotation. However, it takes many times to refer to all of the alignment marks whereby it also takes many times to conduct the chip-in-alignment, resulting in a drop of the throughput. If, for example, the chip-in-alignment is conducted with reference to four alignment marks provided in each chip, the necessary time for conducting the chip-in-alignment is much longer by four times than when the shot array alignment is conducted with reference to only a single alignment mark provided in each chip. If the exposure is made to the 256-mega dynamic random access memory chips in 8-inches wafer, the throughput of the shot array alignment with reference to the single alignment mark provided in each chip is 55 wafers per hour, whilst the throughput of the chip-in-alignment with reference to the plural alignment marks provided in each chip is 26 wafers per hour.

In the above circumstances, it had been required to develop a novel method of a highly accurate alignment between mask pattern and wafer pattern while keeping a high throughput.

SUMMARY OF THE INVENTION

Accordingly, it is an object of the present invention to provide a novel method of an alignment between mask pattern and wafer pattern free from the above problems.

It is a further object of the present invention to provide a novel method of a highly accurate alignment between mask pattern and wafer pattern while keeping a high throughput.

It is a still further object of the present invention to provide a novel method of referring an alignment mark for conducting an alignment between mask pattern and wafer pattern free from the above problems.

It is a further object of the present invention to provide a novel method of referring an alignment mark for conducting a highly accurate alignment between mask pattern and wafer pattern with keeping a high throughput.

In accordance with the present invention, an alignment between a mask pattern and a wafer pattern in a projection exposure system is conducted by the steps of: classifying all chips to be used for the alignment into a plurality of different groups; and referring alignment marks provided at different chip-positions predetermined in accordance with the different groups, wherein the alignment marks are provided at the same chip-in-position for the same group but the alignment marks are different in chip-in-position in accordance with the different groups.

It is preferable that a single alignment mark is provided at a predetermined position in each chip, wherein the predetermined position is determined to accord to the corresponding group. Even the same number of the alignment marks are referred by the novel alignment method as the shot array alignment, the novel alignment realizes the same high accuracy as the chip-in-alignment.

It is also preferable for realizing the highly accurate alignment that the chips classified into one group are distributed over the wafer and further the different positions of the different type alignment marks are also distributed over an individual chip, so that the alignment marks belonging to the one group are distributed over the wafer.

It is further preferable that based upon off-set values obtained by the alignments referring to the alignment marks belonging to each group, a scaling value and a rotation value are calculated to be used for compensation of the misalignment in superimposition of the chips, so as to keep a high throughput and to compensate the chip scaling and hip rotation.

Namely, in accordance with the present invention, all of the chips to be used for alignment are classified into a plurality of groups so that the shot array alignment is carried out by referring to the alignment marks which are provided at different positions in individual chips wherein the positions are determined to accord to the individual groups Further, the off-set values are calculated from the shot array alignments for every different groups so as to calculate chip scaling and chip rotation for compensation of the misalignment in superimposition of the chips.

The above and other objects, features and advantages of the present invention will be apparent from the following descriptions.

BRIEF DESCRIPTION OF THE DRAWINGS

Preferred embodiments according to the present invention will be described in detail with reference to the accompanying drawings.

DESCRIPTION OF THE PREFERRED EMBODIMENT

The first aspect of the present invention provides an arrangement of alignment marks on chips for conducting an alignment between a mask pattern and a wafer pattern, wherein a plurality of different types of alignment marks are provided at predetermined different chip positions in correspondence with the same number of different groups as the different types of alignment marks, wherein all of chips selected for the alignment are classified into the different groups.

It is preferable that the chips classified into each of the different groups are distributed over a wafer.

It is also preferable that the predetermined different chip positions are distributed within each chip.

The second aspect of the present invention provides a method of providing alignment marks on chips for conducting an alignment between a mask pattern and a wafer pattern, wherein a plurality of different types of alignment marks are provided at predetermined different chip positions in correspondence with the same number of different groups as the different types of alignment marks, wherein all of chips selected for the alignment are classified into the different groups.

It is preferable that the chips classified into each of the different groups are distributed over a wafer.

It is also preferable that the predetermined different chip positions are distributed within each chip.

The third aspect of the present invention provides a method of referring to alignment marks on chips for conducting an alignment between a mask pattern and a wafer pattern, wherein, for each of different groups into which all of chips selected for the alignment are classified, a reference is made to a corresponding one of different types of alignment marks for each of the different groups, where the different types of alignment marks are provided at predetermined different chip positions in correspondence with the different groups.

The fourth aspect of the present invention provides a method of an alignment between a mask pattern and a wafer pattern by referring to alignment marks on chips, wherein all of chips selected for the alignment are classified into different groups, so that, for each of the different groups, a reference is made to a corresponding one of different types of alignment marks for each of the different groups, where the different types of alignment marks are provided at predetermined different chip positions in correspondence with the different groups.

It is preferable that different off-set values are further obtained for the different groups so as to calculate chip scaling values and chip rotation values.

It is further preferable that a compensation to a misalignment between chips is further made based upon the calculated chip scaling values and chip rotation values.

The fifth aspect of the present invention provides a system of an alignment between a mask pattern and a wafer pattern by referring to alignment marks on chips, wherein the system classifying all of chips selected for the alignment into different groups, so that, for each of the different groups, a reference is made to a corresponding one of different types of alignment marks for each of the different groups, where the different types of alignment marks are provided at predetermined different chip positions in correspondence with the different groups.

It is preferable that different off-set values are further obtained for the different groups so as to calculate chip scaling values and chip rotation values.

It is further preferable that a compensation to a misalignment between chips is further made based upon the calculated chip scaling values and chip rotation values.

Figure 5:
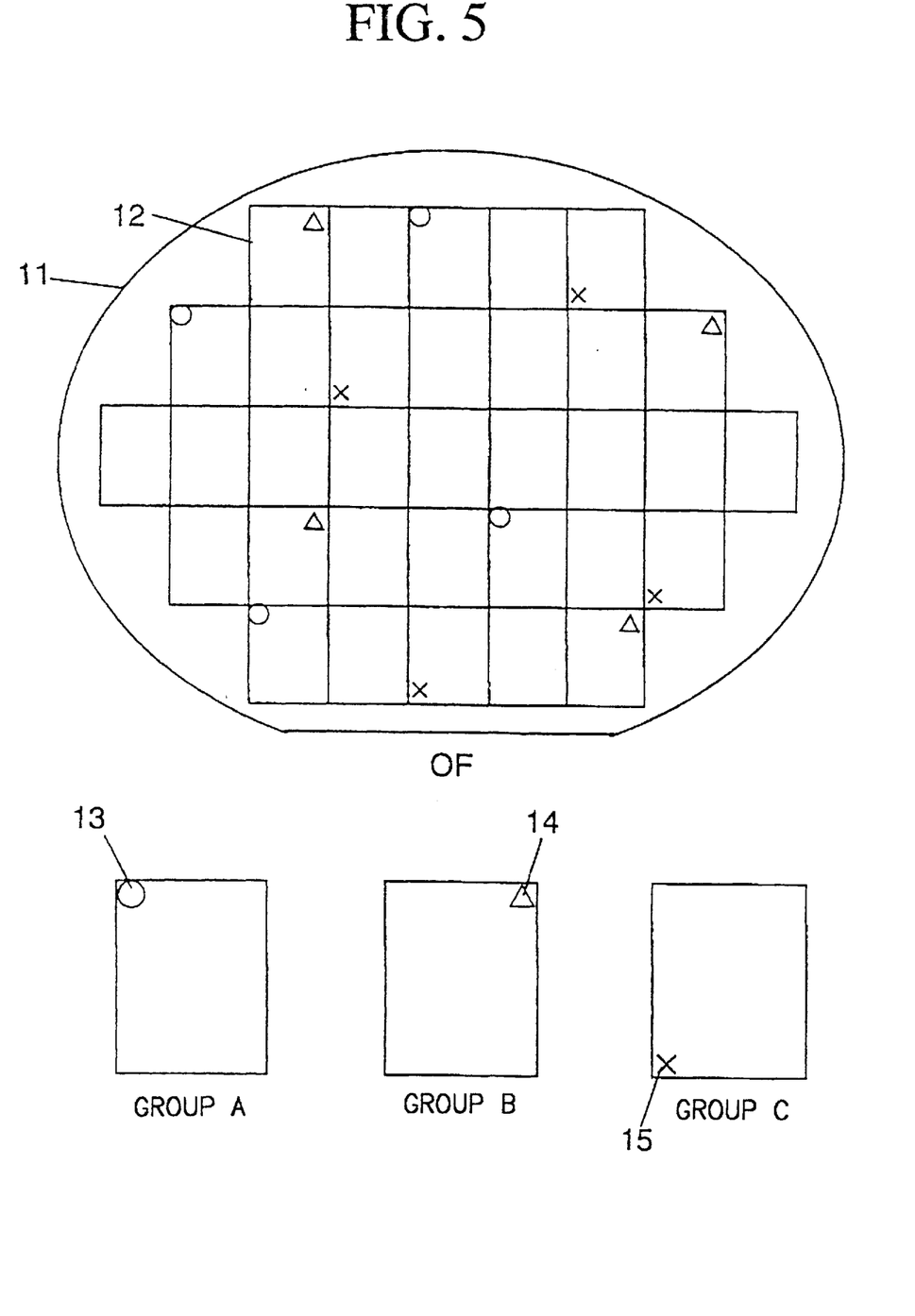
FIG. 5 is a plan view illustrative of a novel method of alignment between mask pattern and wafer pattern in a first embodiment in accordance with the present invention.

First Embodiment:

A first embodiment according to the present invention will be described in detail with reference to FIG. 5, wherein a novel method of alignment between a mask pattern and a wafer pattern is provided.

Some of chips 12 over a semiconductor wafer 11 are selected to be used for an alignment. The selected chips are further classified into three groups, for example, Group A, Group B and Group C. Each of the chips has any one of three different alignment marks which are provided at three predetermined different positions in each chip. The different three types of the alignment marks for the three groups are positioned in the predetermined different three positions so that alignment marks belonging to a selected one of the three groups and being at a predetermined position in each chip are referenced. Each of the chips classified into the Group A has a first type alignment mark "○" 13 at a top left corner of each chip so that the first type alignment mark "○" 13 is referred to for the novel alignment. Each of the chips classified into the Group B has a second type alignment mark "Δ" 14 at a top right corner of each chip so that the second type alignment mark "Δ" 14 is referred to for the novel alignment. Each of the chips classified into the Group C has a third type alignment mark "×" 15 at a bottom left corner of each chip so that the third type alignment mark "×" 15 is referred to for the novel alignment.

The three types of the alignment marks "○" 13, "Δ" 14 and "×" 15 are distributed in individual chips so that the first, second and third alignment marks "○" 13, "Δ" 14 and "×" 15 are positioned at the top left corner, at the top right corner and the bottom left corner. The individual chips belonging to the Groups A, B and C are distributed over the wafer 11.

From the positional information belonging to the individual Groups A, B and C, the chip scaling, the chip rotation and the orthogonality are calculated for every group. Those parameters are ideally equivalent to individual groups. In practice, those parameters obtained for every group are averaged for every group for feeding the averaged values for every group back to the exposure process.

In prior art, the same type of the alignment marks are provided at a predetermined position of the chip so that some chips are selected for the shot array alignment.

In accordance with the present invention, however, the different types of the alignment marks are provided at predetermined different chip positions for the different groups into which all of the selected chips for the alignment are classified so that the shot array alignment is conducted by referring to the corresponding type of the alignment marks for the individual groups.

From the positional information of the alignment marks, the individual off-set values are obtained for every group. The off-set value is defined to be the same as a shift amount of the alignment marks. If either a chip scaling or a chip rotation exists, then the off-set values for the individual groups are different from each other. The off-set values for individual groups are associated with or relate to the chip shift amount, the chip scaling and the chip rotation. Those relationships are given by the following determinants.

$$\begin{pmatrix} f_{XA} \\ f_{XB} \\ f_{XC} \end{pmatrix} = \begin{pmatrix} 1 & a_{XA} & a_{YA} \\ 1 & a_{XB} & a_{YB} \\ 1 & a_{XC} & a_{YC} \end{pmatrix} \begin{pmatrix} F_x \\ S_x \\ R_x \end{pmatrix}$$

$$\begin{pmatrix} f_{YA} \\ f_{YB} \\ f_{YC} \end{pmatrix} = \begin{pmatrix} 1 & a_{YA} & a_{XA} \\ 1 & a_{YB} & a_{XB} \\ 1 & a_{YC} & a_{XC} \end{pmatrix} \begin{pmatrix} F_Y \\ S_Y \\ -R_Y \end{pmatrix}$$

where $f_{ij}$ is the off-set amount defined to be an amount the of shift in position of alignment mark (nm); $F_i$ is the chip shift amount (nm); $S_i$ is the chip scaling (ppm); $R_i$ is the chip rotation (micro-rad); and $a_{ij}$ is the chip-in-coordinates (nm) (i=X or Y, j=A or B or C). The clockwise direction of the chip rotation is the positive. The rotations around the individual axis are defined to be the chip rotations. It was assumed that the chip scaling values are identical with each other within each group and the chip rotation values are also identical with each other within each group.

"$a_{ij}$" is a constant and "$f_{ij}$" is obtainable from the alignments for every groups $F_i$, $S_i$, and $R_i$ are also obtainable from the above determinants.

Those obtained parameters are used to be fed back to the lens projection magnification, the rotation direction of the reticle and the movement of the wafer stage in the exposure process so as to realize a highly accurate alignment similarly to the chip-in-alignment. It is preferable that a total number of the alignment marks provided on the wafer is the same as the shot array alignment where each chip has only a single alignment mark, whereby the shot array alignment can be carried out at the same high accuracy as the chip-in-alignment.

This novel alignment method is applied to the 256-mega dynamic random access memory, wherein a chip area is 16 mm×24 mm and each chip has the first, second and third alignment marks "○" 13, "Δ" 14 and "×" 15 which are positioned at the top left corner, at the top right corner and the bottom left corner. The chip-in-coordinates "$a_{ij}$" and the off-set values "$f_{ij}$" are as follows.

$$a_{XA} = -8 \quad a_{YA} = 12 \quad a_{XB} = 8 \quad a_{YB} = 12$$
$$a_{XC} = -8 \quad a_{YC} = -12 \quad \text{(unit ; nm)}$$
$$f_{XA} = 90 \quad f_{YA} = 14 \quad f_{XB} = 42 \quad f_{YB} = -34$$
$$f_{XC} = 18 \quad f_{YC} = 134 \quad \text{(unit ; nm)}$$

In the above case, the chip shift value $F_i$, the chip scaling $S_i$ and the chip rotation $R_i$ can be obtained by the above determinant as follows.

$$F_X = 30 \quad F_Y = 50 \quad \text{(unit ; nm)}$$
$$S_X = -3 \quad S_Y = -5 \quad \text{(unit ; ppm)}$$
$$R_X = 3 \quad R_Y = 3 \quad \text{(unit ; micro-rad)}$$

If the alignment is made with reference to positional information of only one type of the three alignment marks, for example, only the first alignment mark "○" 13 belonging to the Group A, then the misalignment is zero at a position of the first alignment mark "○" 13. However, a misalignment $M_i$ at the center of the chip and a misalignment $M'_i$ at the bottom right corner of the chip are as follows.

$$M_x = F_X - f_{XA} = 30 - 90 = -60 \text{ nm}$$
$$M_Y = F_Y - f_{YA} = 50 - 14 = 36 \text{ nm}$$
$$M'_x = 2 \times M_x = -120 \text{ nm}$$
$$M'_Y = 2 \times M_Y = 72 \text{ nm}$$

From the above, it can be understood that the misalignment $M'_i$ at the bottom right corner of the chip is largely beyond the acceptable misalignment of 70 nm or 0.07 micrometers for the 256-mega dynamic random access memory.

The above novel alignment method is applied to the projection exposure process for allowing compensations of the chip scaling and chip rotation even with keeping a high throughput, resulting in improvements in reliability and productivity.

Figure 6:
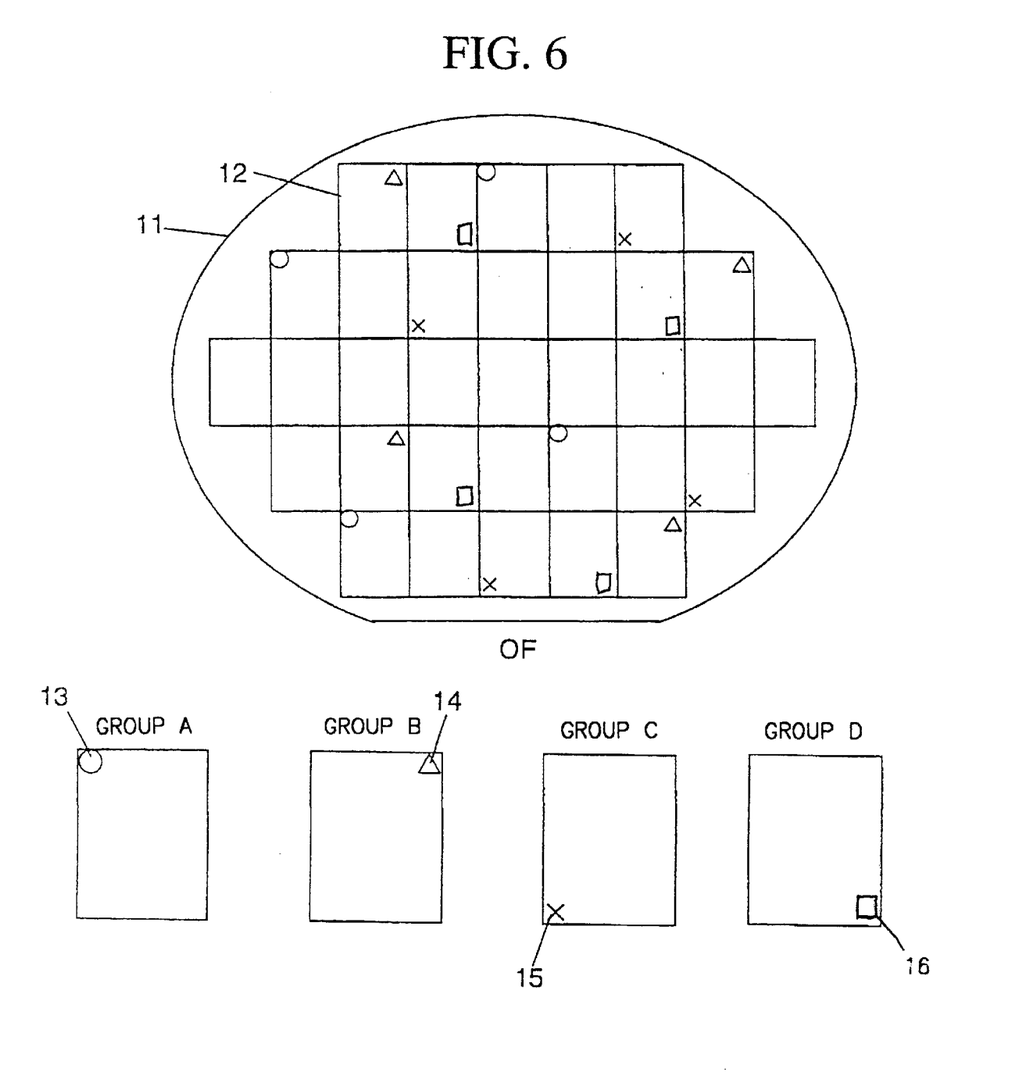
FIG. 6 is a plan view illustrative of a novel method of alignment between mask pattern and wafer pattern in a second embodiment in accordance with the present invention.

Second Embodiment:

A second embodiment according to the present invention will be described in detail with reference to FIG. 6, wherein a novel method of alignment between a mask pattern and a wafer pattern is provided.

Some of all chips 12 over a semiconductor wafer 11 are selected to be used for an alignment. The selected chips are further classified into four groups, for example, Group A, Group B, Group C and Group D.

Each of the chips has any one of four different alignment marks which are provided at predetermined different four positions in each chip. The different four types of the alignment marks for the four groups are positioned in the predetermined different four positions so that alignment marks belonging to a selected one of the four groups and being at a predetermined position in each chip are referenced. Each of the chips classified into the Group A has a first type alignment mark "○" 13 at a top left corner of the each chip so that the first type alignment mark "○" 13 is referred to for the novel alignment. Each of the chips classified into the Group B has a second type alignment mark "Δ" 14 at a top right corner of the each chip so that the second type alignment mark "Δ" 14 is referred to for the novel alignment. Each of the chips classified into the Group C has a third type alignment mark "×" 15 at a bottom left corner of the each chip so that the third type alignment mark "×" 15 is referred to for the novel alignment.

Each of the chips classified into the Group D has a fourth type alignment mark "□" 16 at a bottom right corner of the each chip so that the fourth type alignment mark "□" 16 is referred to for the novel alignment.

The four types of the alignment marks "○" 13, "Δ" 14, "×" 15 and "□" 16 are distributed in individual chip so that the first, second, third and fourth alignment marks "○" 13, "Δ" 14, "×" 15 and "□" 16 are positioned at the top left corner, at the top right corner, the bottom left corner and the bottom right corner. The individual chips belonging to the Groups A, B, C and D are distributed over the wafer 11.

From the positional information of the alignment marks belonging to the individual Groups A, B, C and D, the chip scaling, the chip rotation and the orthogonality are calculated for every group. Those parameters are ideally equivalent to individual groups. In practice, those parameters obtained for every group are averaged for every group for feeding the averaged values for every groups back to the exposure process.

In prior art, the same type of the alignment marks are provided at a predetermined position of the chip so that some chips are selected for the shot array alignment.

In accordance with the present invention, however, the different types of the alignment marks are provided at predetermined different chip positions for the different groups into which all of the selected chips for the alignment are classified so that the shot array alignment is conducted by referring to the corresponding type of the alignment marks for the individual groups.

From the positional information of the alignment marks, the individual off-set values are obtained for every groups. The off-set value is defined to be the same as a shift amount of the alignment marks. If either a chip scaling or a chip rotation exists, then the off-set values for the individual groups are different from each other. The off-set values for individual groups are associated with or relate to the chip shift amount, the chip scaling and the chip rotation. Those relationships are given by the following determinants.

$$\begin{pmatrix} f_{XA} \\ f_{XB} \\ f_{XC} \\ f_{XD} \end{pmatrix} = \begin{pmatrix} 1 & a_{XA} & a_{YA} & 0 \\ 1 & a_{XB} & a_{YB} & 0 \\ 1 & a_{XC} & a_{YC} & 0 \\ 1 & a_{XD} & a_{YD} & 0 \end{pmatrix} \begin{pmatrix} F_x \\ S_x \\ R_x \\ 0 \end{pmatrix}$$

$$\begin{pmatrix} f_{YA} \\ f_{YB} \\ f_{YC} \\ f_{YD} \end{pmatrix} = \begin{pmatrix} 1 & a_{YA} & a_{XA} & 0 \\ 1 & a_{YB} & a_{XB} & 0 \\ 1 & a_{YC} & a_{XC} & 0 \\ 1 & a_{YD} & a_{XD} & 0 \end{pmatrix} \begin{pmatrix} F_Y \\ S_Y \\ -R_Y \\ 0 \end{pmatrix}$$

where $f_{ij}$ is the off-set amount defined to be an amount of the of shift in position of alignment mark (nm); $F_i$ is the chip shift amount (nm); $S_i$ is the chip scaling (ppm); $R_i$ is the chip rotation (micro-rad); and $a_{ij}$ is the chip-in-coordinates (nm) (i=X or Y, j=A or B or C or D). The clockwise direction of the chip rotation is the positive. The rotations around the individual axis are defined to be the chip rotations. It was assumed that the chip scaling values are identical with each other within each group and the chip rotation values are also identical with each other within each group.

"$a_{ij}$" is a constant and "$f_{ij}$" is obtainable from the alignments for every group. $F_i$, $S_i$, and $R_i$ are also obtainable from the above determinants. Those obtained parameters are used to be fed back to the lens projection magnification, the rotation direction of the reticle and the movement of the wafer stage in the exposure process so as to realize a highly accurate alignment similarly to the chip-in-alignment. It is preferable that a total number of the alignment marks provided on the wafer is the same as the shot array alignment where each chip has only a single alignment mark, whereby the shot array alignment can be carried out at the same high accuracy as the chip-in-alignment.

The number of the alignment marks in each chip are larger by one than the number of the alignment mark in the first embodiment, for which reason the accuracy of the alignment is improved.

The above novel alignment method is applied to the projection exposure process for allowing compensations of the chip scaling and chip rotation even with keeping a high throughput, resulting in improvements in reliability and productivity.

Figure 7:
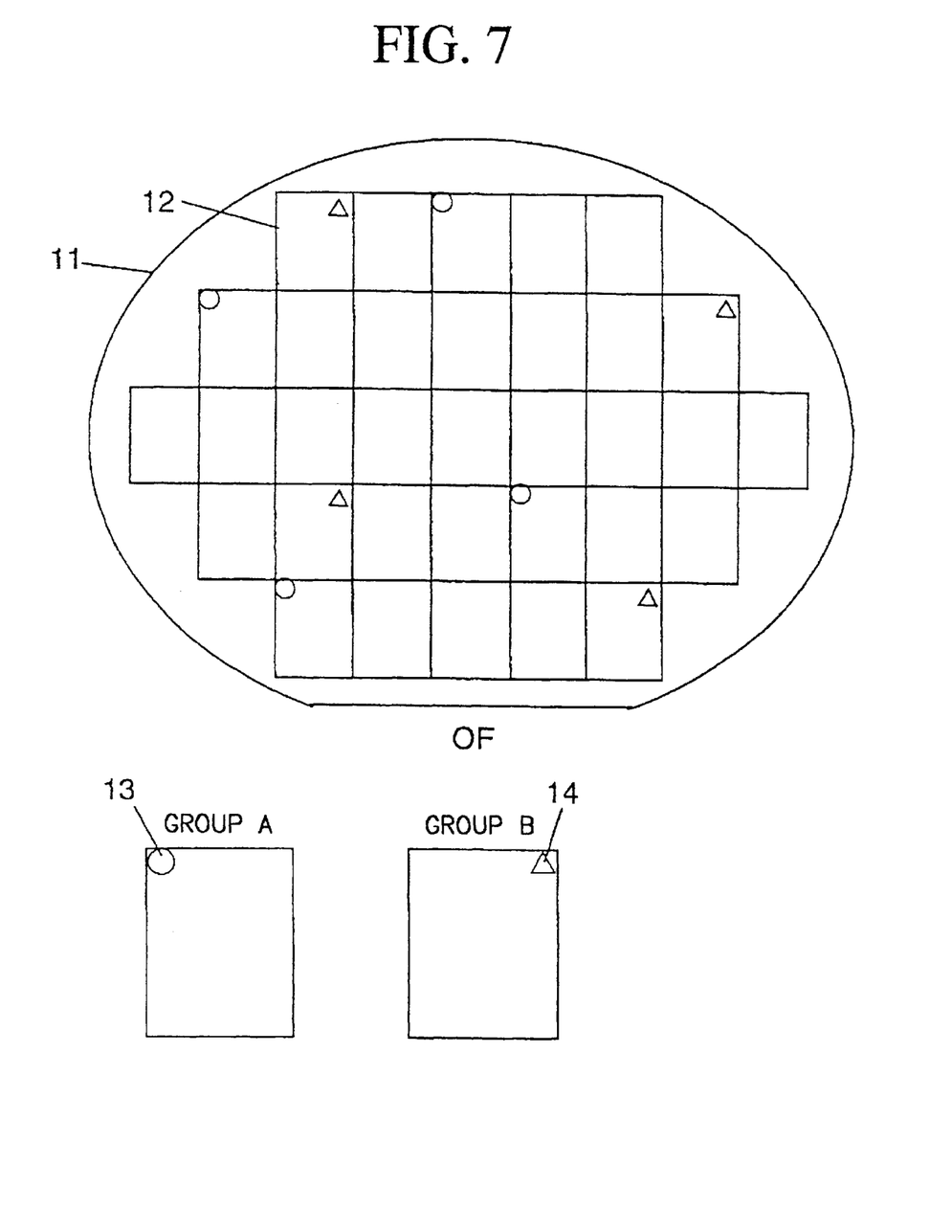
FIG. 7 is a plan view illustrative of a novel method of alignment between mask pattern and wafer pattern in a third embodiment in accordance with the present invention.

Third Embodiment:

A third embodiment according to the present invention will be described in detail with reference to FIG. 7, wherein a novel method of alignment between a mask pattern and a wafer pattern is provided.

Some of all chips 12 over a semiconductor wafer 11 are selected to be used for an alignment. The selected chips are further classified into two groups, for example, Group A and Group B.

Each of the chips has any one of two different alignment marks which are provided at predetermined different two positions in each chip. The different two types of the alignment marks for the two groups are positioned in the predetermined different two positions so that alignment marks belonging to a selected one of the two groups and being at a predetermined position in each chip are referred. Each of the chips classified into the Group A has a first type alignment mark "○" 13 at a top left corner of the each chip so that the first type alignment mark "○" 13 is referred for the novel alignment. Each of the chips classified into the Group B has a second type alignment mark "Δ" 14 at a top right corner of the each chip so that the second type alignment mark "Δ" 14 is referred for the novel alignment.

This embodiment is, for example, applicable to when at least one of the off-set value, the chip scaling and the chip rotation is sufficiently small for allowing no need to compensate this parameter.

The two types of the alignment marks "○" 13 and "Δ" 14 are distributed in individual chip so that the first and second alignment marks "○" 13 and "Δ" 14 are positioned at the top left corner and at the top right corner. The individual chips belonging to the Groups A and B are distributed over the wafer 11.

From the positional informations of the alignment marks belonging to the individual Groups A and B, the chip scaling, the chip rotation and the orthogonality are calculated for every groups. Those parameters are ideally equivalent to individual groups. In practice, those parameters obtained for every groups are averaged for every groups for feeding the averaged values for every groups back to the exposure process.

In prior art, the same type of the alignment marks are provided at a predetermined position of the chip so that some chips are selected for the shot array alignment.

In accordance with the present invention, however, the different types of the alignment marks are provided at predetermined different chip positions for the different groups into which all of the selected chips for the alignment are classified so that the shot array alignment is conducted by referring to the corresponding type of the alignment marks for the individual groups.

From the positional information of the alignment marks, the individual off-set values are obtained for every groups. The off-set value is defined to be the same as a shift amount of the alignment marks. If either a chip scaling or a chip rotation exists, then the off-set values for the individual groups are different from each other. The off-set values for individual groups are associated with or relate to the chip shift amount, the chip scaling and the chip rotation. The following description will be made in case of almost zero chip rotation value. Those relationships are given by the following determinants.

$$\begin{pmatrix} f_{XA} \\ f_{XB} \end{pmatrix} = \begin{pmatrix} 1 & a_{XA} \\ 1 & a_{XB} \end{pmatrix} \begin{pmatrix} F_x \\ S_x \end{pmatrix}$$

$$\begin{pmatrix} f_{YA} \\ f_{YB} \end{pmatrix} = \begin{pmatrix} 1 & a_{YA} \\ 1 & a_{YB} \end{pmatrix} \begin{pmatrix} F_Y \\ S_Y \end{pmatrix}$$

where $f_{ij}$ is the off-set amount defined to be an amount of the of shift in position of alignment mark (nm); $F_i$ is the chip shift amount (nm); $S_i$ is the chip scaling (ppm); $R_i$ is the chip rotation (micro-rad); and $a_{ij}$ is the chip-in-coordinates (nm) (i=X or Y, j=A or B). The clockwise direction of the chip rotation is the positive. The rotations around the individual axis are defined to be the chip rotations. It was assumed that the chip scaling values are identical with each other within each group and the chip rotation values are also identical with each other within each group.

"$a_{ij}$" is a constant and "$f_{ij}$" is obtainable from the alignments for every groups. $F_i$, $S_i$, and $R_i$ are also obtainable from the above determinants. Those obtained parameters are used to be fed back to the lens projection magnification, the rotation direction of the reticule and the movement of the wafer stage in the exposure process so as to realize a highly accurate alignment similarly to the chip-in-alignment. It is preferable that a total number of the alignment marks provided on the wafer is the same as the shot array alignment where each chip has only a single alignment mark, whereby the shot array alignment can be carried out at the same high accuracy as the chip-in-alignment.

The area of each alignment mark is not less than 100 micrometer-m$^2$. The number of the alignment marks in each chip is reduced to two. This results in a reduction in a total area of the alignment marks within each chip. This allows an increase in density of integration of the semiconductor devices.

Needless to say, this third embodiment is applicable to when either the off-set value or the chip scaling is sufficiently small for allowing no need to compensate the parameter. This third embodiment is also applicable to either when at least two of the set-off value, the chip scaling and the chip rotation are sufficiently small for allowing no need to compensate those parameters or when at least one of the X or Y component is sufficiently small.

The above novel alignment method is applied to the projection exposure process for allowing compensations of the chip scaling and chip rotation even with keeping a high throughput, resulting in improvements in reliability and productivity.

The above novel alignment method also allows a reduction in alignment area or alignment margin thereby enabling a size down of the chips.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. An arrangement of mask pattern-to-wafer pattern alignment marks on a wafer of chips, wherein chips in a first group of the chips have a first alignment mark in a first chip position, and chips in a second group of the chips have a second alignment mark in a second chip position, and wherein the first and second alignment marks are different from one another, and the first and second chip positions are different from one another.

2. The arrangement of claim 1, wherein chips in one of the groups are not in another of the groups.

3. The arrangement of claim 1, wherein the first and second chip positions are within the chips.

4. The arrangement of claim 3, wherein the first and second chip positions are in different corners of the chips.

5. The arrangement of claim 1, wherein chips in a third group of the chips have a third alignment mark in a third chip position, and wherein the third alignment mark is different from the first and second alignment marks, and the third chip position is different from the first and second chip positions.

6. The arrangement of claim 5, wherein chips in the third group are not in the first and second groups.

7. The arrangement of claim 5, wherein chips in a fourth group of the chips have a fourth alignment mark in a fourth chip position, and wherein the fourth alignment mark is different from the first, second and third alignment marks, and the fourth chip position is different from the first, second and third chip positions.

8. A method of arranging mask pattern-to-wafer pattern alignment marks on a wafer of chips, comprising the steps of:

placing a first alignment mark in a first chip position on chips in a first group of the chips, and placing a second alignment mark in a second chip position on chips in a second group of the chips, wherein the first and second alignment marks are different from one another, and the first and second chip positions are different from one another.

9. The method of claim 8, further comprising the step of placing a third alignment mark in a third chip position on chips in a third group of the chips, and wherein the third alignment mark is different from the first and second alignment marks, and the third chip position is different from the first and second chip positions.

10. The method of claim 9, further comprising the step of placing a fourth alignment mark in a fourth chip position on chips in a fourth group of the chips, and wherein chips in the fourth group are not in the first, second and third groups, the fourth alignment mark is different from the first, second and third alignment marks, and the fourth chip position is different from the first, second and third chip positions.

11. The method of claim 10, where the four groups of chips are mutually exclusive.

12. A method of aligning mask pattern-to-wafer pattern alignment marks on a wafer of chips, comprising the steps of:

referring to a first alignment mark in a first chip position on chips in a first group of the chips, and referring to a second alignment mark in a second chip position on chips in a second group of the chips, wherein the first and second alignment marks are different from one another, and the first and second chip positions are different from one another.

13. The method of claim 12, further comprising the step of referring to a third alignment mark in a third chip position on chips in a third group of the chips, and wherein the third alignment mark is different from the first and second alignment marks, and the third chip position is different from the first and second chip positions.

14. The method of claim 13, further comprising the step of referring to a fourth alignment mark in a fourth chip position on chips in a fourth group of the chips, and wherein the fourth alignment mark is different from the first, second and third alignment marks, and the fourth chip position is different from the first, second and third chip positions.

15. A system for aligning mask pattern-to-wafer pattern alignment marks on a wafer of chips, wherein the system refers to a first alignment mark in a first chip position on chips in a first group of the chips, and refers to a second alignment mark in a second chip position on chips in a second group of the chips, and wherein the first and second alignment marks are different from one another, and the first and second chip positions are different from one another.

16. The system of claim 15, wherein the groups are mutually exclusive.

17. The system of claim 15, wherein the first and second chip positions are within the chips.

18. The system of claim 15, wherein the system also refers to a third alignment mark in a third chip position on chips in a third group of the chips, and wherein the third alignment mark is different from the first and second alignment marks, and the third chip position is different from the first and second chip positions.

19. The system of claim 18, wherein the system also refers to a fourth alignment mark in a fourth chip position on chips in a fourth group of the chips, and wherein the fourth alignment mark is different from the first, second and third alignment marks, and the fourth chip position is different from the first, second and third chip positions.

* * * * *